(12) United States Patent
Baars et al.

(10) Patent No.: US 10,032,891 B2
(45) Date of Patent: Jul. 24, 2018

(54) FINFET BASED FLASH MEMORY CELL

(71) Applicant: GLOBALFOUNDRIES Inc., Grand Cayman (KY)

(72) Inventors: Peter Baars, Dresden (DE); Juergen Faul, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/498,652

(22) Filed: Apr. 27, 2017

(65) Prior Publication Data

US 2017/0271484 A1   Sep. 21, 2017

Related U.S. Application Data

(62) Division of application No. 15/075,352, filed on Mar. 21, 2016, now Pat. No. 9,666,589.

(51) Int. Cl.
| | |
|---|---|
| *H01L 29/66* | (2006.01) |
| *H01L 29/423* | (2006.01) |
| *H01L 29/788* | (2006.01) |
| *H01L 29/78* | (2006.01) |
| *H01L 27/115* | (2017.01) |
| *H01L 27/088* | (2006.01) |
| *H01L 21/266* | (2006.01) |
| *H01L 21/768* | (2006.01) |
| *H01L 21/8234* | (2006.01) |

(Continued)

(52) U.S. Cl.
CPC ...... *H01L 29/66825* (2013.01); *H01L 21/266* (2013.01); *H01L 21/7684* (2013.01); *H01L 21/76883* (2013.01); *H01L 21/823431* (2013.01); *H01L 21/823437* (2013.01); *H01L 21/823821* (2013.01); *H01L 21/823828* (2013.01); *H01L 27/0886* (2013.01); *H01L 27/11521* (2013.01); *H01L 27/11524* (2013.01); *H01L 27/11536* (2013.01); *H01L 27/11543* (2013.01); *H01L 29/42324* (2013.01); *H01L 29/42328* (2013.01); *H01L 29/6681* (2013.01); *H01L 29/66545* (2013.01); *H01L 29/785* (2013.01); *H01L 29/788* (2013.01); *H01L 29/7881* (2013.01)

(58) Field of Classification Search
None
See application file for complete search history.

(56) References Cited

U.S. PATENT DOCUMENTS

| | | | |
|---|---|---|---|
| 9,318,367 B2 | 4/2016 | Huang et al. | |
| 2013/0037877 A1 | 2/2013 | Tan et al. | |

(Continued)

*Primary Examiner* — Erik Kielin
(74) *Attorney, Agent, or Firm* — Amerson Law Firm, PLLC

(57) ABSTRACT

A method of manufacturing a flash memory cell is provided including forming a plurality of semiconductor fins on a semiconductor substrate, forming floating gates for a sub-set of the plurality of semiconductor fins and forming a first insulating layer between the plurality of semiconductor fins. The first insulating layer is recessed to a height less than the height of the plurality of semiconductor fins and sacrificial gates are formed over the sub-set of the plurality of semiconductor fins. A second insulating layer is formed between the sacrificial gates and, after that, the sacrificial gates are removed. Recesses are formed in the first insulating layer and sense gates and control gates are formed in the recesses for the sub-set of the plurality of semiconductor fins. The first and second insulating layers may be oxide layers.

20 Claims, 13 Drawing Sheets

(51) Int. Cl.
*H01L 21/8238* (2006.01)
*H01L 27/11536* (2017.01)
*H01L 27/11524* (2017.01)
*H01L 27/11543* (2017.01)
*H01L 27/11521* (2017.01)

(56) References Cited

U.S. PATENT DOCUMENTS

2013/0270627 A1 10/2013 Cheng et al.
2014/0239404 A1 8/2014 Huang et al.
2015/0111355 A1 4/2015 Lee et al.
2016/0042793 A1 2/2016 Forbes
2017/0005102 A1 1/2017 Feng et al.

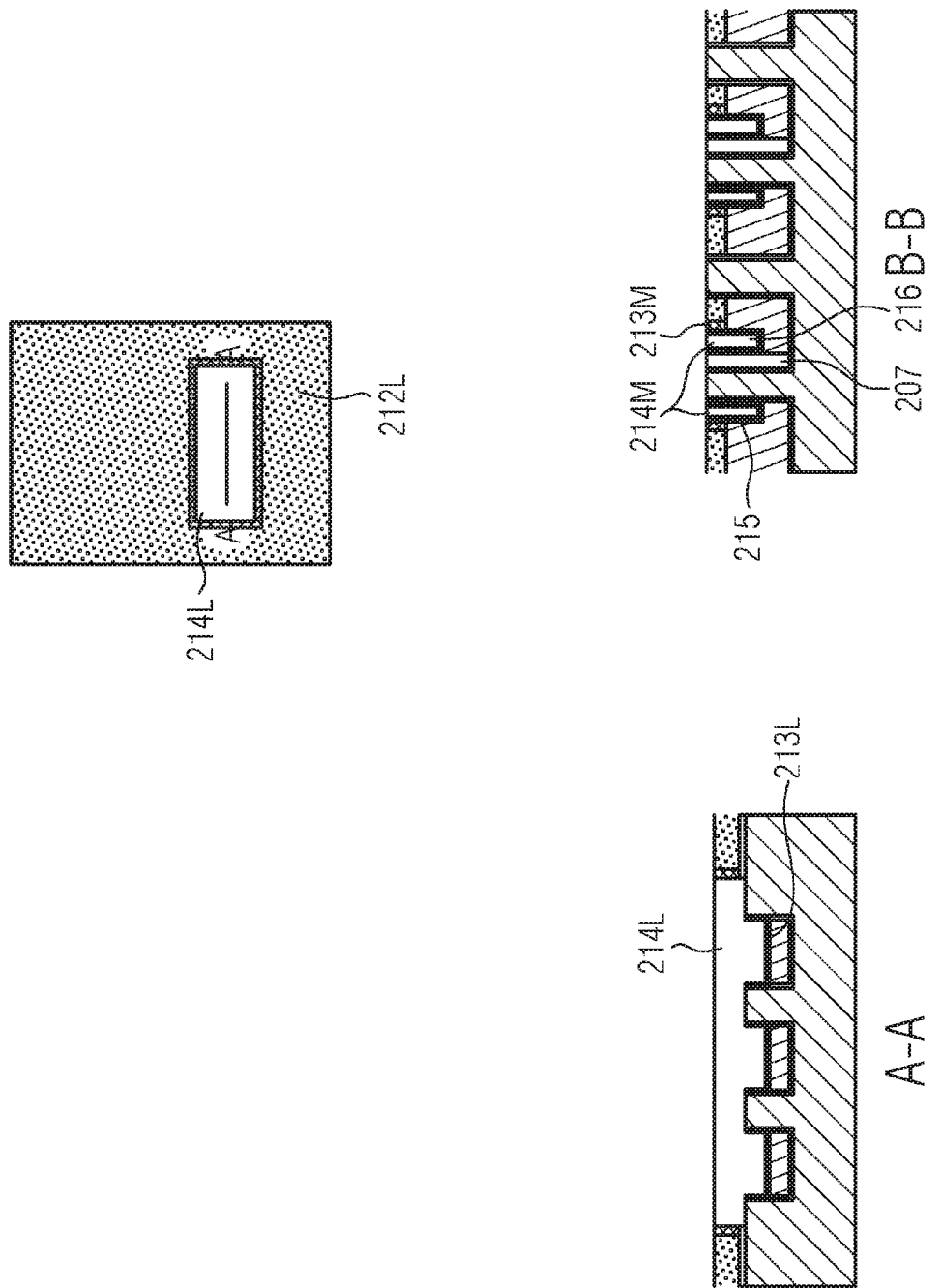

FINFET BASED FLASH MEMORY CELL

BACKGROUND

1. Field of the Disclosure

Generally, the present disclosure relates to the field of integrated circuits and semiconductor devices and, more particularly, to flash memory cells.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

Although significant advantages may be obtained with respect to performance and controllability of sophisticated planar transistor architectures, in view of further device scaling, new transistor configurations have been proposed in which a "three-dimensional" architecture may be provided in an attempt to obtain a desired channel width, while at the same time maintaining superior controllability of the current flow through the channel region. To this end, so-called FinFETS have been proposed in which a thin sliver or fin of silicon may be formed in a thin active layer of an SOI (semiconductor-on-insulator) substrate, wherein at least on both sidewalls of the fin, and possibly on a top surface thereof, a gate dielectric material and a gate electrode material may be provided, thereby realizing a "double gate" or "tri-gate" transistor, the channel region of which may be fully depleted. Typically, in sophisticated applications, the width of the semiconductor, e.g., silicon, fins is on the order of 10-20 nm and the height thereof is on the order of 30-40 nm. Thus, FinFET transistor architectures, which may also be referred to herein as multiple gate transistors, may provide advantages with respect to increasing the effective coupling of the gate electrode to the various channel regions without requiring a corresponding reduction in the thickness of the gate dielectric material. Moreover, by providing this non-planar transistor architecture, the effective channel width may also be increased so that, for given overall transistor dimensions, an enhanced current drive capability may be accomplished. For these reasons, great efforts have been made in order to provide enhanced transistor performance on the basis of non-planar transistor architectures.

It is noted that both planar and three-dimensional transistor devices can be formed according to the replacement gate approach or the gate first approach. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HKMG gate structure for the device is formed. Using the gate first technique, on the other hand, involves forming a stack of layers of material across the substrate, wherein the stack of materials includes a high-k gate insulation layer (with a dielectric constant k larger than 5), one or more metal layers, a layer of polysilicon, and a protective cap layer, for example, silicon nitride. One or more etching processes are performed to pattern the stack of materials to thereby define the basic gate structures for the transistor devices. Formation of an e-fuse in accordance with the present disclosure can be readily integrated in both the replacement gate process flow and gate first process flow.

On the other hand, increasingly, non-volatile flash memory cells may have to be incorporated in sophisticated semiconductor devices, wherein the flash memory technique represents one promising technology, in which MOS technology may be efficiently applied to forming storage cells. To this end, basically, a field effect transistor is provided, in which transistor operation is controlled, on the other hand, by a gate electrode, as discussed above, which additionally includes a floating gate that is electrically insulated from the control gate electrode and from the channel region and drain region of the field effect transistor. The floating gate represents a dielectric charge storage region within the control gate electrode of the field effect transistor and may hold stationary charge carriers, which in turn influence the current flow behavior of the field effect transistor. The stationary charge carriers in the floating gate may be injected upon establishing a specific operation mode, which is also referred to as programming of the memory cell, in which per se negative effects, such as hot carrier injection and the like, that is, any type of leakage current generating mechanism, may result in the incorporation of charge carriers in the charge storage region. Consequently, in the normal operation mode, the injected charge carriers in the charge storage region may thus significantly affect the current flow through the channel region of the transistor, which may be detected by appropriate control circuitry. On the other hand, upon erasing the memory cell, the charge carriers in the charge storage region may be removed, for instance by establishing appropriate voltage conditions, thereby establishing a detectable different operational behavior of the field effect transistor during the normal operation mode, i.e., during the operation with the standard supply voltages.

Although the concept of flash memory cells, i.e., of field effect transistors comprising a floating gate, provides a non-volatile storage mechanism with moderately high information density and low access times, it turns out that further device scaling and compatibility to other sophisticated mask technologies may be difficult to be achieved on the basis of conventional concepts for forming non-volatile storage transistors. Particularly, forming flash memory cells integrated with FinFET devices has not successfully been achieved in the past.

In view of the situation described above, the present disclosure provides (flash) memory cells with improved performance characteristics as compared to the art and integrated within the process flow of manufacturing FinFET devices.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to flash memory cells. According to the disclosure, flash memory cells can be formed on the basis of FinFET devices. In particular, the manufacture of the flash memory cells in a memory area of a wafer can be integrated in the process flow for manufacturing FinFET devices in a logic area of the wafer.

A method of manufacturing a semiconductor device is provided including, among other things, providing a semiconductor substrate, for example, a semiconductor bulk substrate or SOI substrate, forming a first plurality of semiconductor fins in a logic area of the semiconductor substrate, forming a second plurality of semiconductor fins in a memory area of the semiconductor substrate, forming an insulating layer (for example, an oxide layer that may consist of or comprise silicon dioxide) between the fins of the first plurality of semiconductor fins and between the fins of the second plurality of semiconductor fins, forming an electrode layer over the first and second pluralities of semiconductor fins and the insulating layer, forming gates (of a FinFET device) over semiconductor fins of the first plurality of semiconductor fins in the logic area from the gate electrode layer and forming sense gates and control gates (of a memory cell) between semiconductor fins of the second plurality of semiconductor fins in the logic area from the gate electrode layer. The gates in the logic area and the sense gate and control gates are formed from the same electrode layer.

Furthermore, a method of forming a semiconductor device is provided including, among other things, forming a plurality of semiconductor fins on a semiconductor substrate, forming floating gates for a sub-set of the plurality of semiconductor fins on sidewall surfaces of the sub-set of the plurality of semiconductor fins. A first insulating layer is formed between the plurality of semiconductor fins. The first insulating layer is recessed to a height less than a height of the plurality of semiconductor fins. Sacrificial gates are formed over the sub-set of the plurality of semiconductor fins. A second insulating layer is formed between the sacrificial gates. The sacrificial gates are removed to define first gate recesses on a first side of the sub-set of the plurality of semiconductor fins and a second gate recesses on a second side of the sub-set of the plurality of semiconductor fins proximate the floating gates. The first and second gate recesses are extended into the first insulating layer. Sense gates are formed in the first gate recesses and control gates are formed in the second gate recesses.

In addition, a method of manufacturing a flash memory cell is provided including forming a plurality of semiconductor fins on a semiconductor substrate, forming floating gates for a sub-set of the plurality of semiconductor fins and forming a first insulating layer between the plurality of semiconductor fins. The first insulating layer is recessed to a height less than the height of the plurality of semiconductor fins and sacrificial gates are formed over the sub-set of the plurality of semiconductor fins. A second insulating layer is formed between the sacrificial gates and, after that, the sacrificial gates are removed. Recesses are formed in the first insulating layer and sense gates and control gates are formed in the recesses for the sub-set of the plurality of semiconductor fins. The first and second insulating layers may be oxide layers.

Moreover, a flash memory cell is provided including a semiconductor fin formed on a semiconductor substrate, for example, a semiconductor bulk substrate or SOI substrate, wherein the semiconductor fin comprises a first sidewall and a second sidewall. The flash memory cell also includes a sense gate formed neighbored to the first sidewall of the semiconductor fin, a first high-k dielectric (k>5, for example) formed between the sense gate and the first sidewall of the semiconductor fin, a control gate neighbored to the second sidewall of the semiconductor fin, a floating gate arranged between the control gate and the second sidewall of the semiconductor fin, and a second high-k dielectric (k>5, for example) formed between the floating gate and the control gate.

BRIEF DESCRIPTION OF THE DRAWINGS

The disclosure may be understood by reference to the following description taken in conjunction with the accompanying drawings, in which like reference numerals identify like elements, and in which:

FIGS. 2a-2l Illustrate an exemplary process flow for manufacturing a flash memory cell similar to the one illustrated in FIG. 1.

Figure 1:
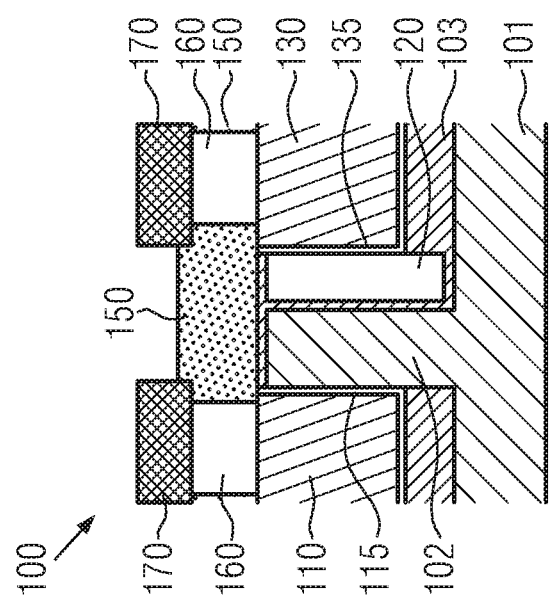
FIG. 1 shows a flash memory cell according to an example of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase. For example, the person skilled in the art will appreciate after a complete reading of the present disclosure that the expression "A over B" is not limited to the understanding that A is directly disposed on B, i.e., A and B being in physical contact.

As used herein, spatial references "top," "bottom," "upper," "lower," "vertical," "horizontal" and the like may be used for convenience when referring to structures of FinFETs. These references are intended to be used in a manner consistent with the drawings only for teaching purposes, and are not intended as absolute references for FinFET structures. For example, FinFETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present methods are applicable to a variety of technologies, for example, NMOS, PMOS, CMOS, etc., and is readily applicable to a variety of devices, including, but not limited to, logic devices, memory devices and particularly flash memory cells. The manufacturing techniques may be integrated in CMOS manufacturing processes. The techniques and technologies described herein can be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

The present disclosure generally provides manufacturing techniques for memory cells formed integrated in a process flow for manufacturing FinFET devices. Particularly, a non-volatile flash memory cell is provided that comprises a single sided flash gate and is integrated in a fully depleted FinFET device. A NAND or NOR flash memory cell architecture can be provided. In the internal circuit configuration of a NOR architecture, the individual memory cells are connected in parallel, which enables the device to achieve random access. This configuration enables the short read times required for the random access of microprocessor instructions. The NOR flash memory architecture is ideal for lower-density, high-speed read applications, which are mostly read only, often referred to as code-storage applications. The NAND flash memory architecture, on the other hand, was developed as an alternative optimized for high-density data storage, giving up random access capability in a tradeoff to achieve a smaller cell size, which translates to a smaller chip size and lower cost-per-bit. This was achieved by creating an array of multiple memory transistors connected in a series.

In the provided flash memory cell, a control/program gate and a floating gate can be provided on one side of a semiconductor fin and a sense gate (flash gate) can be provided on the other side of the semiconductor fin. The sense gate can be formed relatively close to the channel region formed in the semiconductor fin. A high-k dielectric may be used to isolate the semiconductor fin from the sense gate and the floating gate from the control gate. A tunnel oxide may be formed between the semiconductor fin and the floating gate. Programming of the memory cell may be realized based on hot carrier injection caused by a high voltage applied to the control gate and erasing may be realized by tunneling of charge carriers through the high-k dielectric to the control gate. A controllable and effective shift of the threshold voltage by charging or discharging, respectively, can be achieved for the flash memory cell disclosed herein. In fact, accumulated charges of the floating gate may significantly influence the work function of the semiconductor fin, thereby changing/controlling the threshold voltage.

FIG. 1 shows a single flash memory cell 100 usable in a NAND architecture according to an example of the present invention. The flash memory cell 100 may be part of a memory cell array formed on a wafer. Other active and passive semiconductor device may be formed on the same wafer. The memory cell 100 and the memory cell array may be part of an integrated circuit.

The flash memory cell 100 comprises a semiconductor layer 101. The semiconductor layer 101 may be comprised of any appropriate semiconductor material, such as silicon, silicon/germanium, silicon/carbon, other II-VI or III-V semiconductor compounds and the like. The semiconductor layer 101 may be part of a bulk semiconductor substrate wherein insulation regions, for example, shallow trench insulations, may be formed. The bulk semiconductor substrate may be a silicon substrate, in particular, a single crystal silicon substrate. Other materials may be used to form the semiconductor substrate such as, for example, germanium, silicon germanium, gallium phosphate, gallium arsenide, etc. Insulation regions may define active regions and electrically isolate the flash memory cell from other active or passive devices formed on the same substrate. The insulation regions may be parts of a contiguous trench isolation structure and may be formed by etching the bulk semiconductor substrate and filling the formed trenches with some dielectric material, for example, silicon oxide. In principle, the semiconductor layer 101 may be comprised in an SOI wafer. In this case the semiconductor layer 101 is formed on an insulation/buried oxide layer that is formed on a bulk semiconductor substrate. The buried oxide layer may include a dielectric material, such as silicon dioxide, and may be an ultra-thin buried oxide (UT-BOX) having a thickness in a range from about 10-20 nm, for example.

A semiconductor fin 102 is formed on the semiconductor layer 101. The semiconductor fin 102 shown in FIG. 1 may be one of a plurality of semiconductor fins formed on the semiconductor layer 101. The semiconductor fin 102 may be formed from the semiconductor layer 101 by etching or epitaxial growth. The semiconductor fins 102 may be formed by any suitable combination of lithographic processes that may involve forming a pattern and selectively etching a material. For example, the semiconductor fin 102 may be formed using a double patterning process, e.g., resist-on-resist patterning techniques (which may include a lithography-etch-lithography-etch (LELE) process or a lithography-freeze-lithography-etch (LFLE) process). In other embodiments, the fins may be formed using interferometic lithography, imprint lithography, photolithography, extreme ultraviolet (EUV) lithography, or x-ray lithography. A plurality of semiconductor fins may run in parallel in a length direction along a surface of the semiconductor layer 101 and extend in a height direction perpendicular to the surface of the semiconductor layer 101.

The semiconductor fin 102 may have a narrow width of less than 50 nm. An oxide layer (not shown) may be formed on the semiconductor layer 101, in which case the fins run through the oxide layer to the semiconductor layer 101. It should be appreciated that the semiconductor fin 102 may exhibit an appropriate dopant concentration so as to define corresponding drain and source areas. In addition, a channel region of the FinFET device to be formed may be formed by appropriately doping the respective region of the semiconductor fins 102. In alternative examples, the channel region might be maintained undoped.

An insulating layer 103 is formed on the exposed surface of the semiconductor layer 101, sidewalls of the semiconductor fin 102 and on top of the semiconductor fin 102. The insulating layer 103 may comprise or be made of an oxide material, for example, silicon dioxide. Three gates, namely, a sense gate 110, a floating gate 120 and a control gate 130 are comprised in the memory cell 100. The insulting layer 103 functions as a tunnel oxide for the floating gate 120. A high-k dielectric material with a dielectric constant k larger than 5 may be formed between the sense gate 110 and the semiconductor fin 102 to form a sense gate dielectric 115, and a high-k dielectric material with a dielectric constant k larger than 5 may be formed between the control gate 130 and the floating gate 120 to form a control gate dielectric 135. The high-k dielectric material may comprise a transitional metal oxide, such as at least one of hafnium oxide, hafnium dioxide and hafnium silicon-oxynitride. The same or different materials may be used for the formation of the sense gate dielectric 115 and the control gate dielectric 135. The floating gate 120 has to be completely surrounded by electrically insulating material. For example, a thin portion of the insulating layer 103 may cover the top surface of the floating gate 120 as well as a top surface of the semiconductor fin 102.

The sense gate 110 and the control gate 130 may comprise work function adjusting layers. The work function adjusting layers may comprise titanium nitride or any other appropriate work function adjusting metal or metal oxide that is known in the art. The sense gate 110, the floating gate 120 and the control gate 130 may comprise polysilicon. Each of the sense gate 110, the floating gate 120 and the control gate 130 may comprise a metal gate. The material of the metal gate may depend on whether the transistor device to be formed is a P-channel transistor or an N-channel transistor. In embodiments wherein the transistor device is an N-channel transistor, the metal may include La, LaN or TiN. In embodiments wherein the transistor device is a P-channel transistor, the metal may include Al, AlN or TiN.

As it is shown in FIG. 1, an interlayer dielectric 150 may be formed over the semiconductor fin 102, the sense gate 110, the floating gate 120 and the control gate 130. The floating gate 120 may be insulated by the interlayer dielectric 150, the insulating layer 103 and the control gate dielectric 135. The interlayer dielectric 150 may comprise or be made of an oxide material, for example, silicon dioxide. Contacts 160 for electrically contacting the sense gate 110 and the control gate 130 are formed in the interlayer dielectric 150. A first metallization layer comprising electrically conductive structures 170 may be formed over the interlayer dielectric 150 and in electrical and mechanical contact with the contacts 160. The conductive structures 170 and the contacts 160 may comprise a metal, for example, copper or aluminum.

In the following, an exemplary process flow for manufacturing a semiconductor device similar to the one shown in FIG. 1 is described with reference to FIGS. 2a-2l. In these figures, the top rows, when provided, show top views and the bottom rows show cross-sectional views along the lines A-A and B-B indicated in the top views of the figures, respectively. The left columns show, respectively, a logic area of a wafer where active devices, such as FinFET devices, are formed and the right columns, respectively, show a memory area of a wafer where memory cells are formed. Reference numerals including a capital L refer to the logic area and reference numerals including a capital M refer to the memory area. The logic area and the memory area may be separated from each other by an insulating region. However, in the figures, the logic area and the memory area are shown separated from each other.

Figure 2A:
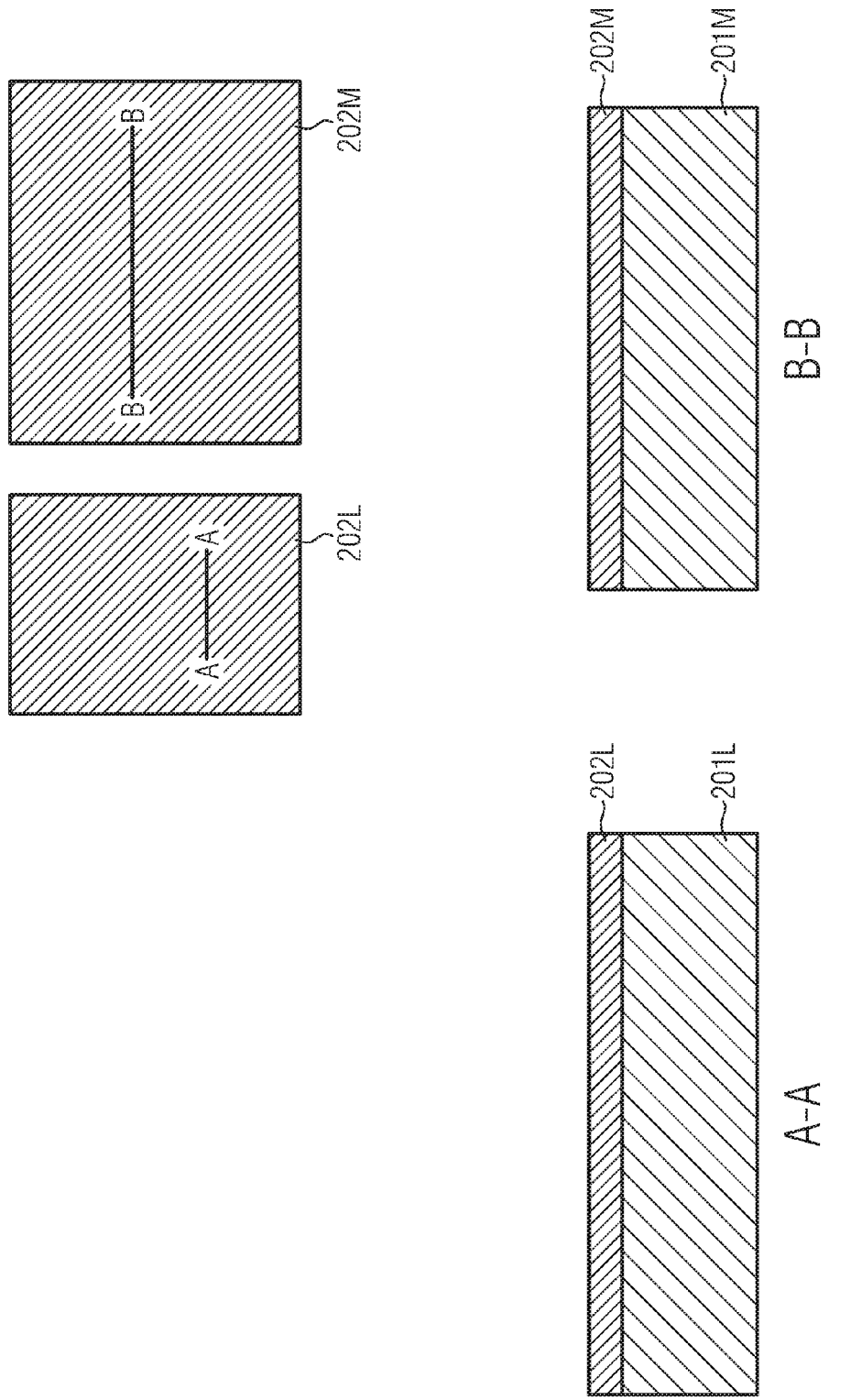

In the manufacturing stage shown in FIG. 2a, a semiconductor substrate 201L, 201M, for example, comprising silicon is provided. The semiconductor substrate 201L, 201M may be a semiconductor bulk substrate or a semiconductor-on-insulator (SOI) substrate as described above. A mask layer 202L, 202M is formed over the semiconductor substrate 201L, 201M. The mask layer 202L, 202M may comprise or consist of a nitride material, for example, silicon nitride. The semiconductor substrate 201L, 201M may comprise doped for regions for providing channel regions of FinFET devices, for example.

Figure 2B:
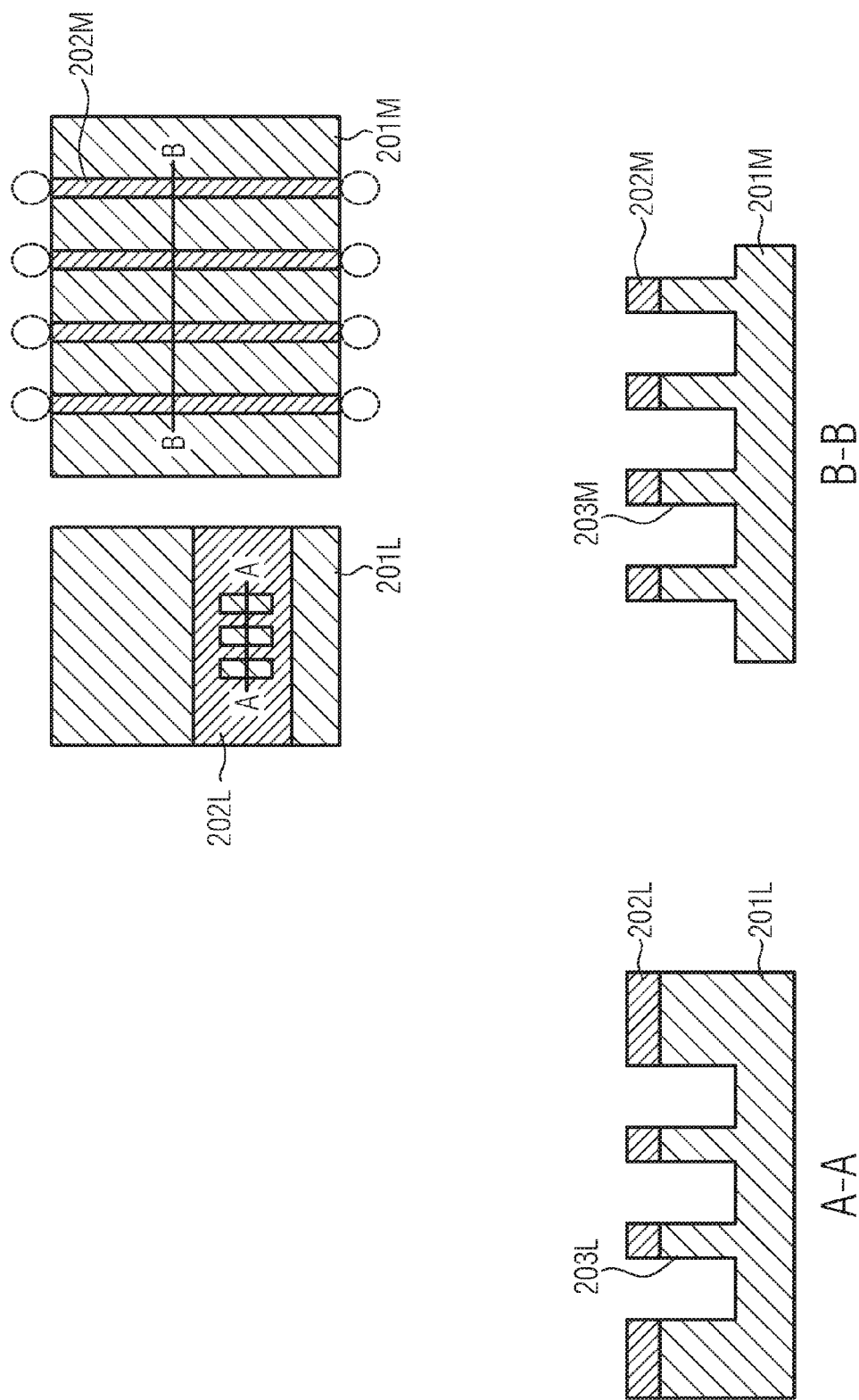

By standard lithography techniques comprising the deposition and patterning of a photoresist (not shown), the mask layer 202L, 202M is patterned and used as an etching mask for etching the semiconductor substrate 201L, 201M (if an SOI semiconductor substrate is provided the semiconductor layer formed on the buried insulating layer is etched) as shown in FIG. 2b. By the etching process, semiconductor fins 203L, 203M are formed in the logic area and the memory area, respectively. In the same etching process, shallow trench isolations may be formed where considered appropriate. The etching process may comprise reactive ion etching or chemical wet etching and it may be followed by chemical mechanical polishing. The dashed circles in FIG. 2b indicate regions where source/drain landing pads may be formed, as it is known in the art.

Figure 2C:
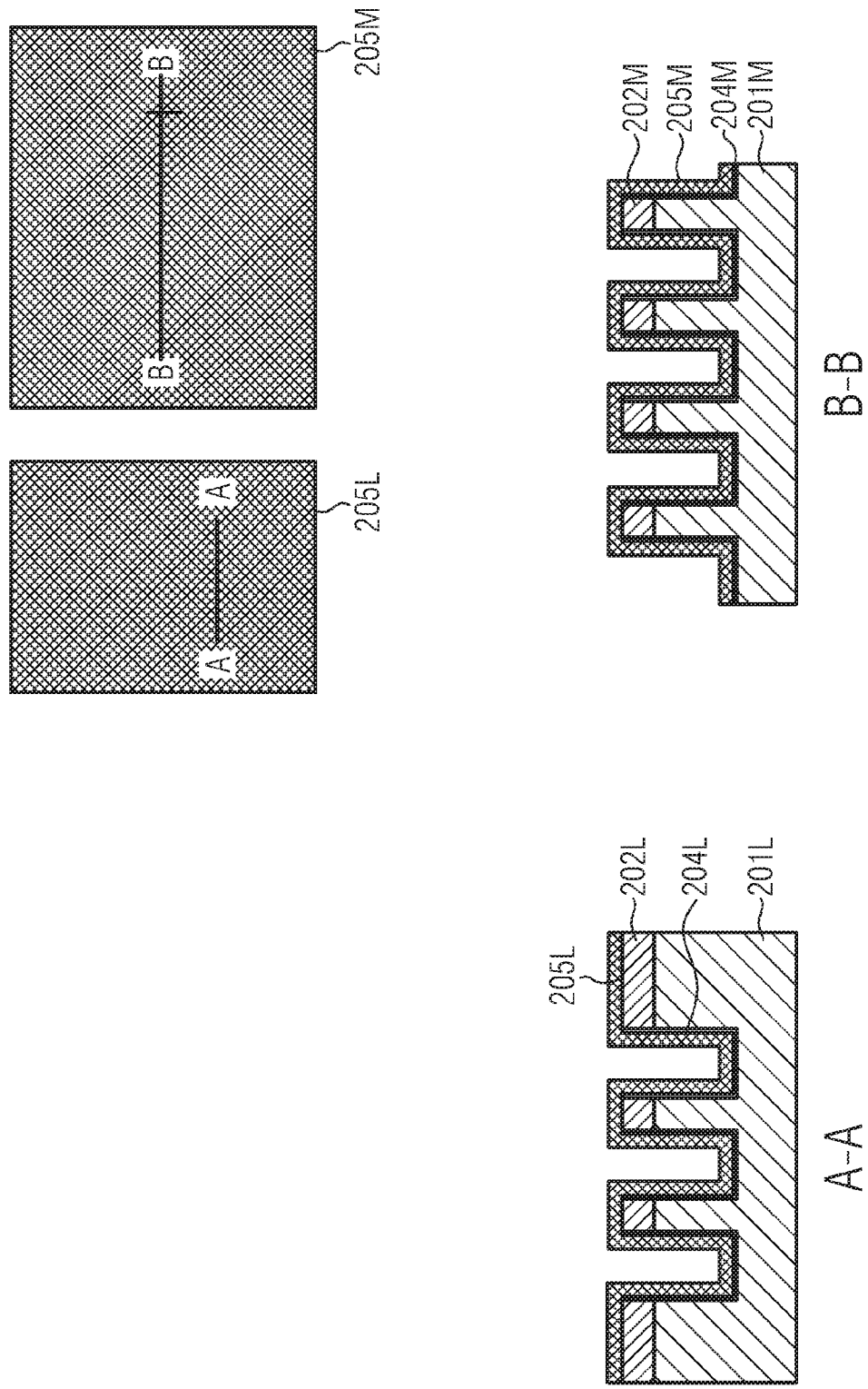

In the manufacturing stage shown in FIG. 2c, an oxide layer 204L, 204M, for example, comprising silicon dioxide, is formed on the semiconductor substrate 201L, 201M and the semiconductor fins 203L, 203M. In the depicted example, the mask layer 202L, 202M is maintained during the oxidation process performed for forming the oxide layer 204L, 204M. A polysilicon layer 205L, 205M is deposited over the resulting structure after the oxidation process. During deposition of the polysilicon layer 205L, 205M, a portion of the oxide layer 204L, 204M may or may not be present on side surfaces and/or top surfaces of the remaining mask layer 202L, 202M. The polysilicon layer 205M is formed in the memory area in order to form floating gates of memory cells. In the logic area, the polysilicon layer 205L has to be completely removed and in the memory area the polysilicon layer 205M has to be patterned in order to form the floating gates. The removal of the polysilicon layer 205L in the logic area and the patterning of the polysilicon layer 205M in the memory area can, for example, be achieved by properly implanting the polysilicon layer 205L, 205M in both areas. An appropriate tilted implantation process is illustrated in FIG. 2d.

The tilted implantation process comprises a first implantation phase I1, a second implantation phase I2 and a third implantation phase I3. In each of the phases I1, I2 and I3, the same implant species may be used. The implant species may comprise nitrogen, for example. During the first implantation phase I1, implantation from the top perpendicular to the semiconductor substrate 201L, 202M is performed. During the second implantation phase I2, implantation from the left (a left tilted implantation) is performed. The order of performing the first implantation I1 and the second implantation I2 can be reversed.

Figure 2D:
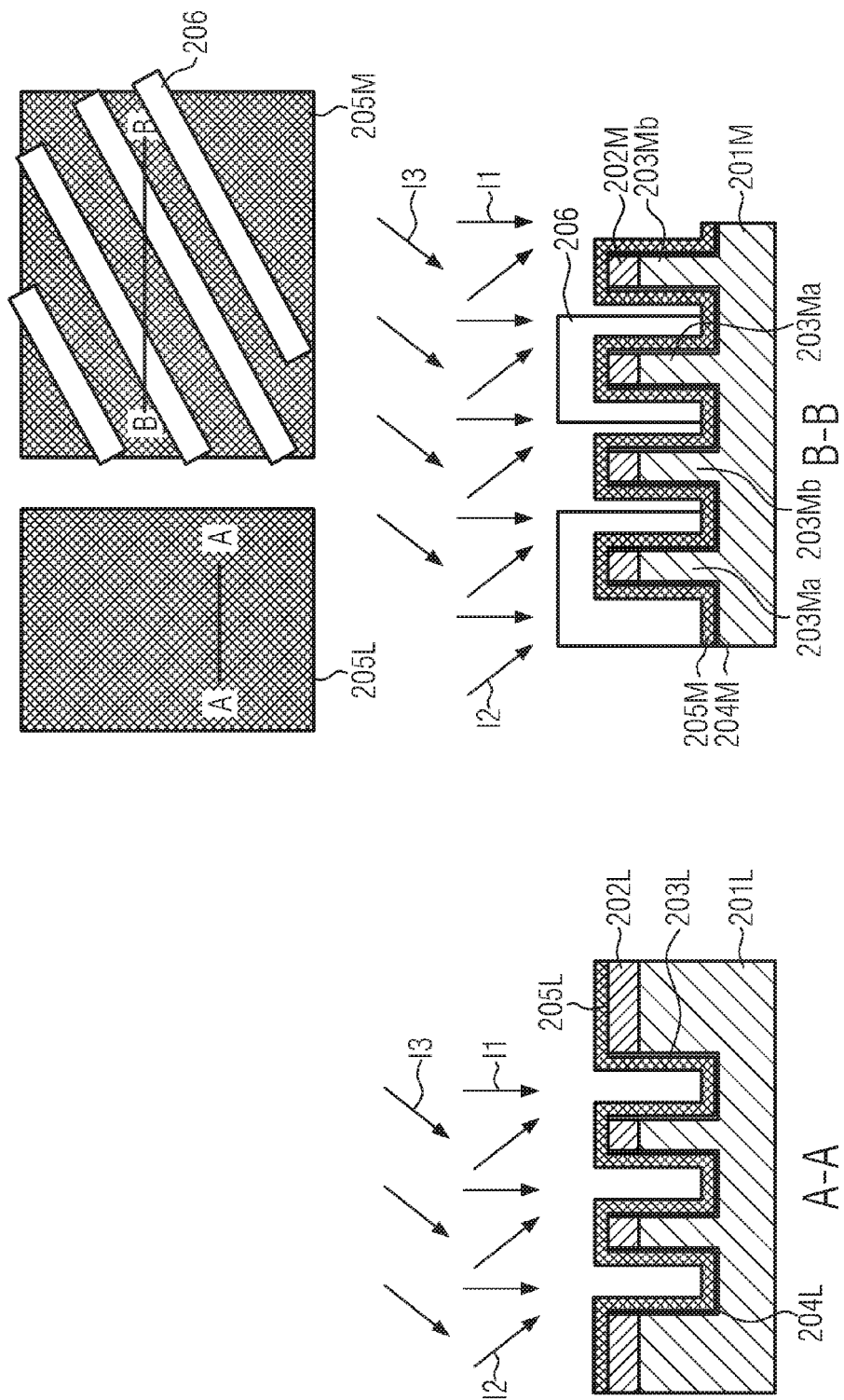

Before performing the third implantation I3, which is an implantation from the right (a right tilted implantation), a structured mask layer 206 is formed over the polysilicon layer 205M in the memory area, as shown in FIG. 2d. The structured mask layer 206 protects portions of the polysilicon layer 205M in the memory area that are formed over right surfaces of the particular semiconductor fins 203M in the memory area that are masked by structured mask layer 206 from implantation during the third implantation phase I3. In FIG. 2d, the masked semiconductor fins are denoted by the reference number 203Ma, whereas semiconductor fins that are not masked by the structured mask layer 206 are denoted by the reference number 203Mb. For example, masked semiconductor fins 203Ma and non-masked semiconductor fins 203Mb may be arranged alternatingly.

Figure 2E:
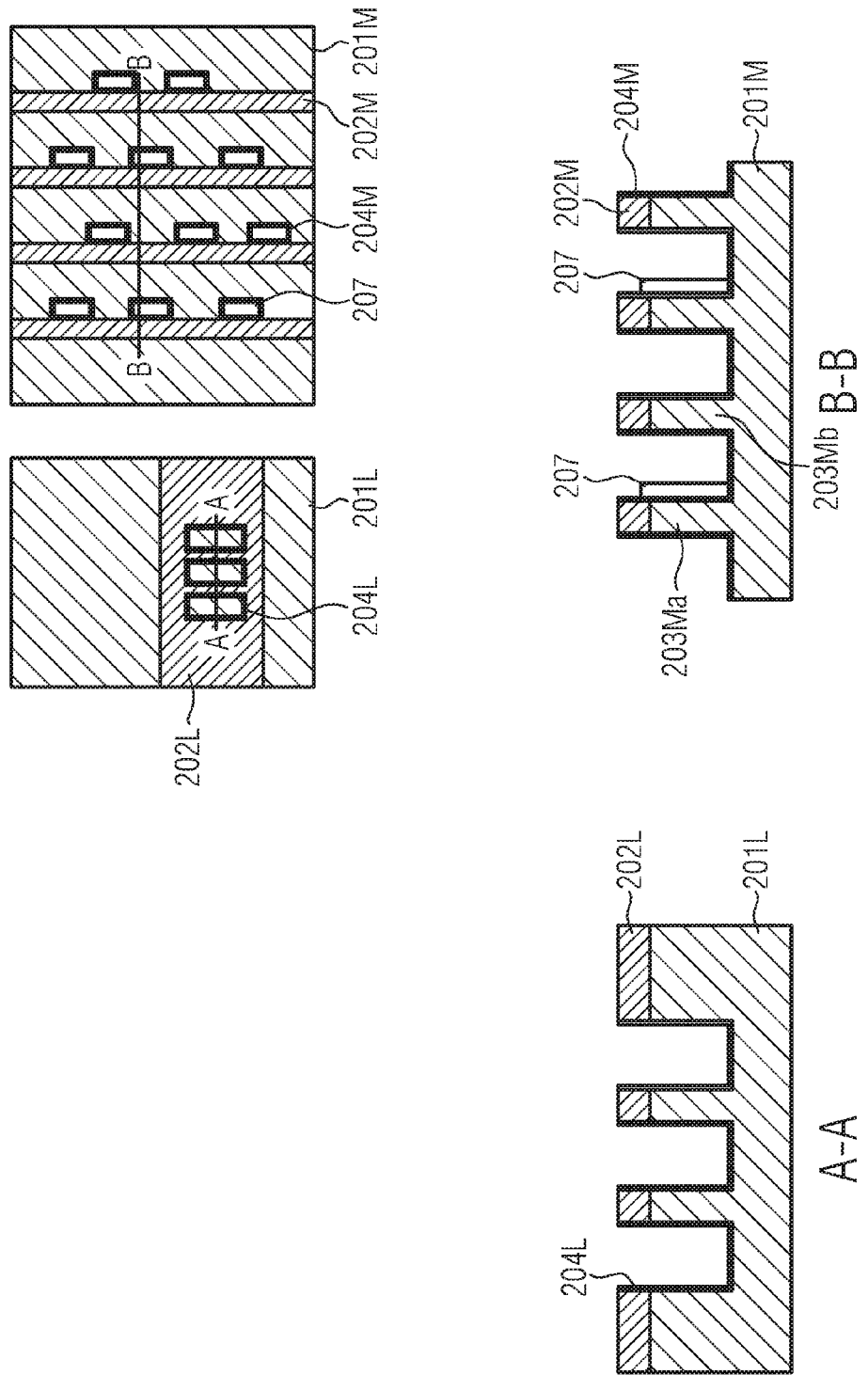

After completion of the three implantation phases I1, I2 and I3, the implanted portions of the polysilicon layer 205L, 205M can be removed, for example, by a wet chemical etching process that is selective to undoped polysilicon. The resulting structure is shown in FIG. 2e. The polysilicon layer 205L in the logic area is completely removed. In the memory area, portions of the polysilicon layer 205M in the memory area that are formed over right surfaces of the particular semiconductor fins 203Ma in the memory area that are masked by structured mask layer 206 are maintained and will form floating gates 207 of the eventually manufactured memory cells.

Figure 2F:
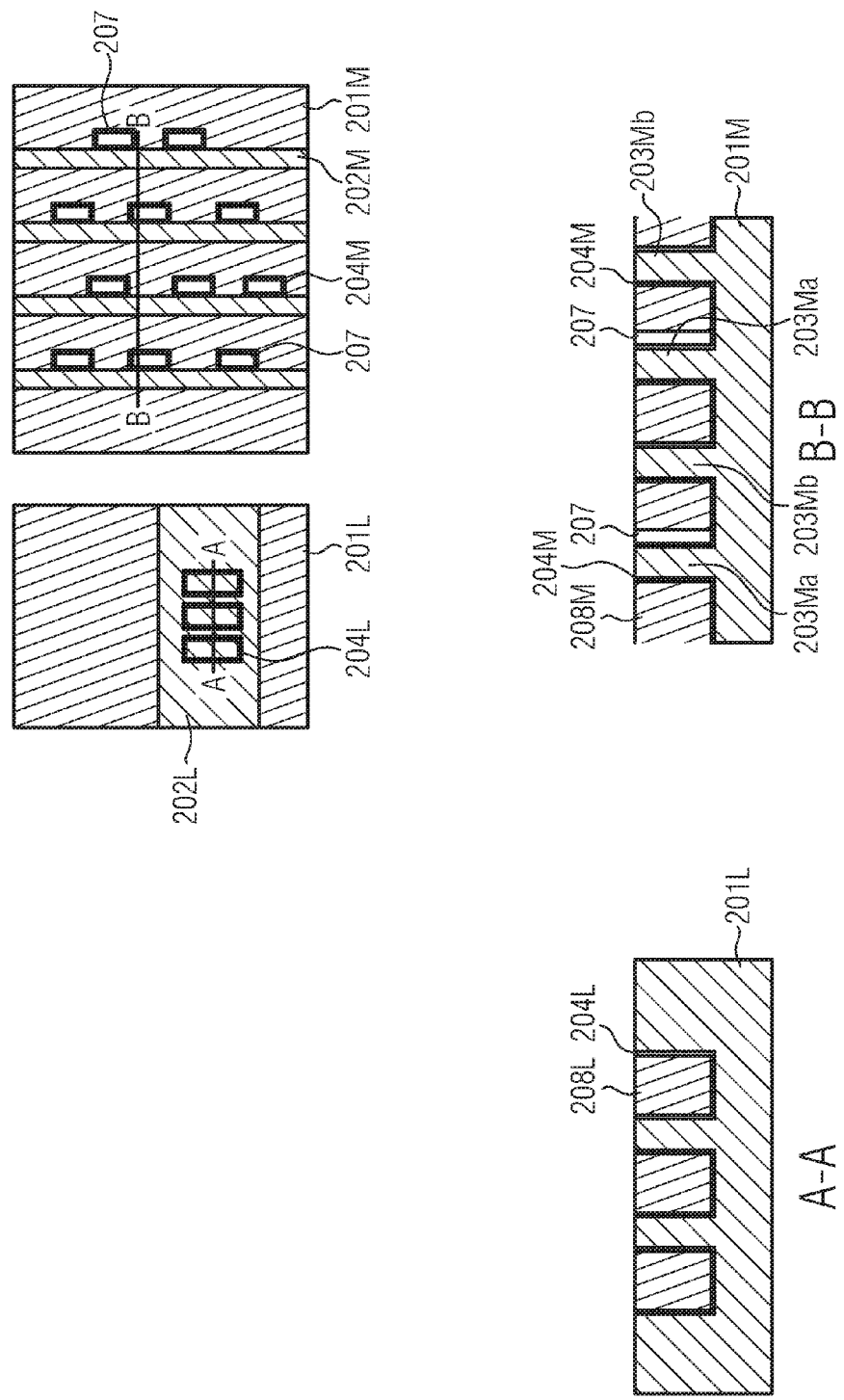

After removal of the implanted portions of the polysilicon layer 205L, 205M, an oxide layer 208L, 208M is formed over the structure, as shown in FIG. 2f. The oxide material is deposited and planarized by chemical mechanical polishing. During the planarization, the remained portions of the mask layer 202L, 202M on top of the semiconductor fins 203 may be fully removed. A thin layer of the mask layer 202L atop of the semiconductor fins 203L may be maintained in the logic area if considered appropriate. In the memory area, memory cells comprising floating gates 207 and separated from each other by isolations fins 203Mb (semiconductor fins that have no adjacent floating gates) can be formed.

Figure 2G:
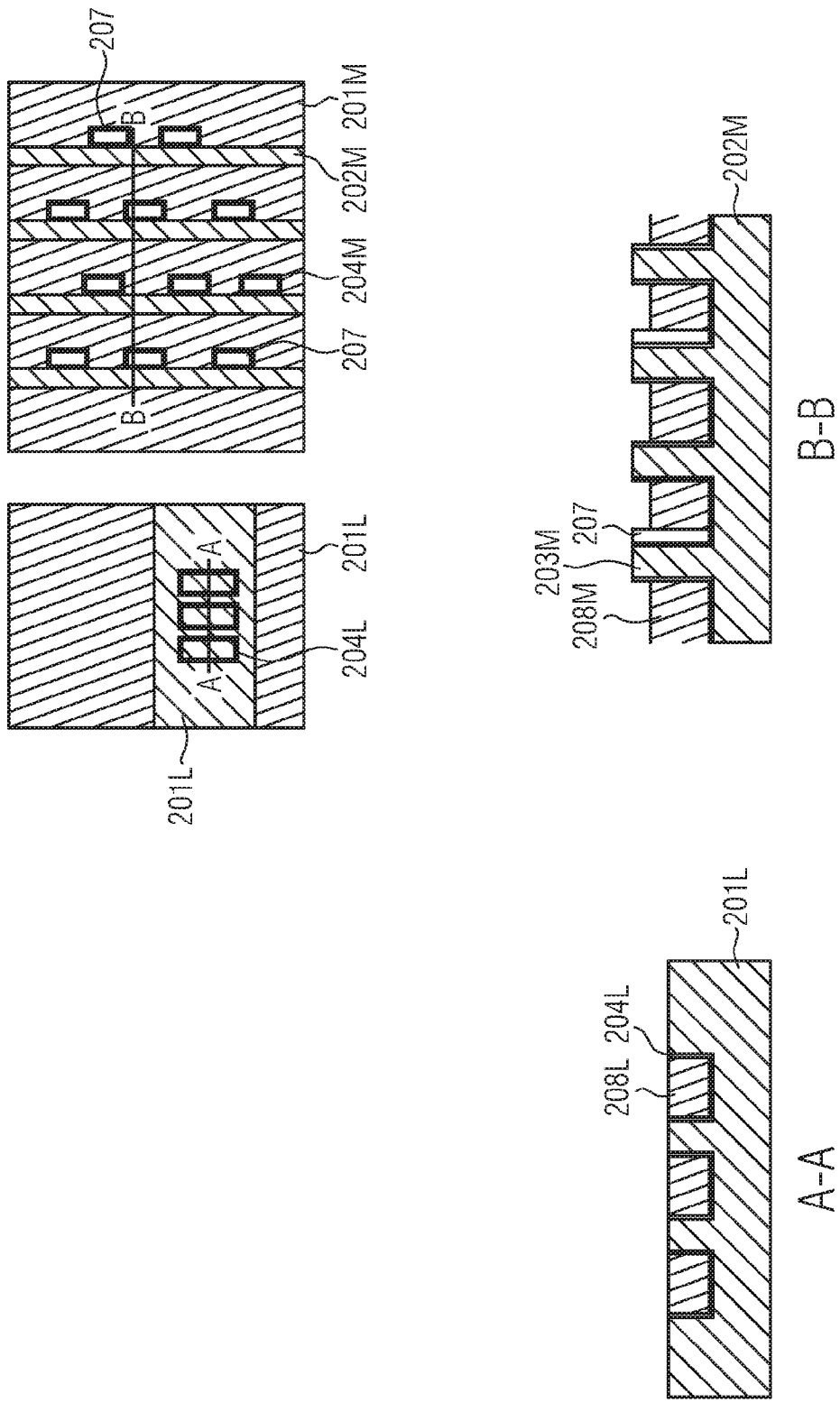

In the manufacturing stage shown in FIG. 2g, the considered logic and memory areas are recessed. An appropriately patterned etching mask may be deposited and a one-step or multi-step etching process may be performed. As shown in FIG. 2g, unselective etching of the oxide material of the oxide layer 208L and the semiconductor material of the semiconductor fins 203L and the semiconductor substrate 201L is performed in the logic area. The level of the resulting structure in the logic area may be recessed by about 35-45 nm, for example, 40 nm as compared to the structure shown in FIG. 2f, i.e., both the height level of the top surfaces of the semiconductor fins 203L and the oxide layer 208L is reduced. On the other hand, the etching process performed in the memory area is selective to the materials of the semiconductor fins 203M and the floating gates 207. The level of the resulting surfaces of the oxide layer 208M in the memory area may be recessed by about 15-25 nm, for example, 20 nm, as compared to the structure shown in FIG. 2f. The height levels of the top surfaces of the floating gates 207 and the semiconductor fins 203M in the memory area lie above the height level of the top surfaces of the semiconductor fins 203L in the logic area after completion of the etching process. The height level of the exposed surface of the oxide layer 208M in the memory area lies above the height level of the oxide layer 208L in the logic area after completion of the etching process. The heights (vertical extensions) of the semiconductor fins 203L in the logic area may be lower than the heights of the semiconductor fins 203M (or 203Ma and 203Mb) in the memory area.

Figure 2H:
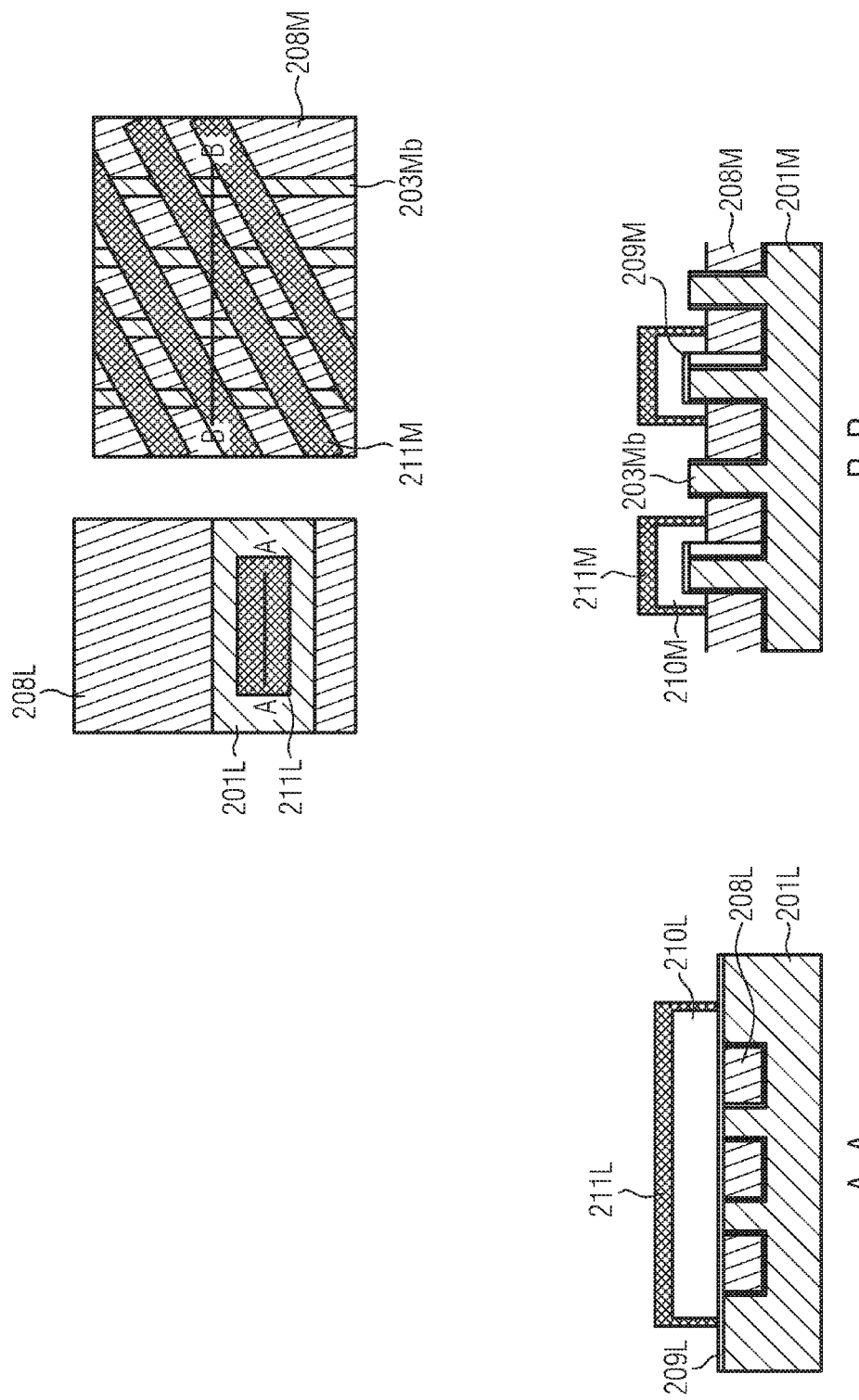

In the manufacturing stage shown in FIG. 2h, a protection layer 209L, 209M is formed over the structure shown in FIG. 2g. The protection layer 209L, 209M may comprise a nitride material and serves for protecting the underlying semiconductor fins 203L, 203M and floating gates 207 during removal of a sacrificial gate in the context of the described exemplary replacement gate approach at a later stage (see description below). It is noted that various implantation steps for forming halo regions, etc., may be performed and gate oxide layers may be deposited where considered appropriate. A sacrificial electrode layer 210L, 210M, for example, comprising or consisting of polysilicon, is formed in the logic and memory areas and patterned by means of a structured etching mask 211L, 211M, for example, comprising a nitride material, as shown in FIG. 2h. Spacer formation and implantation of source/drain regions may follow.

Figure 2I:
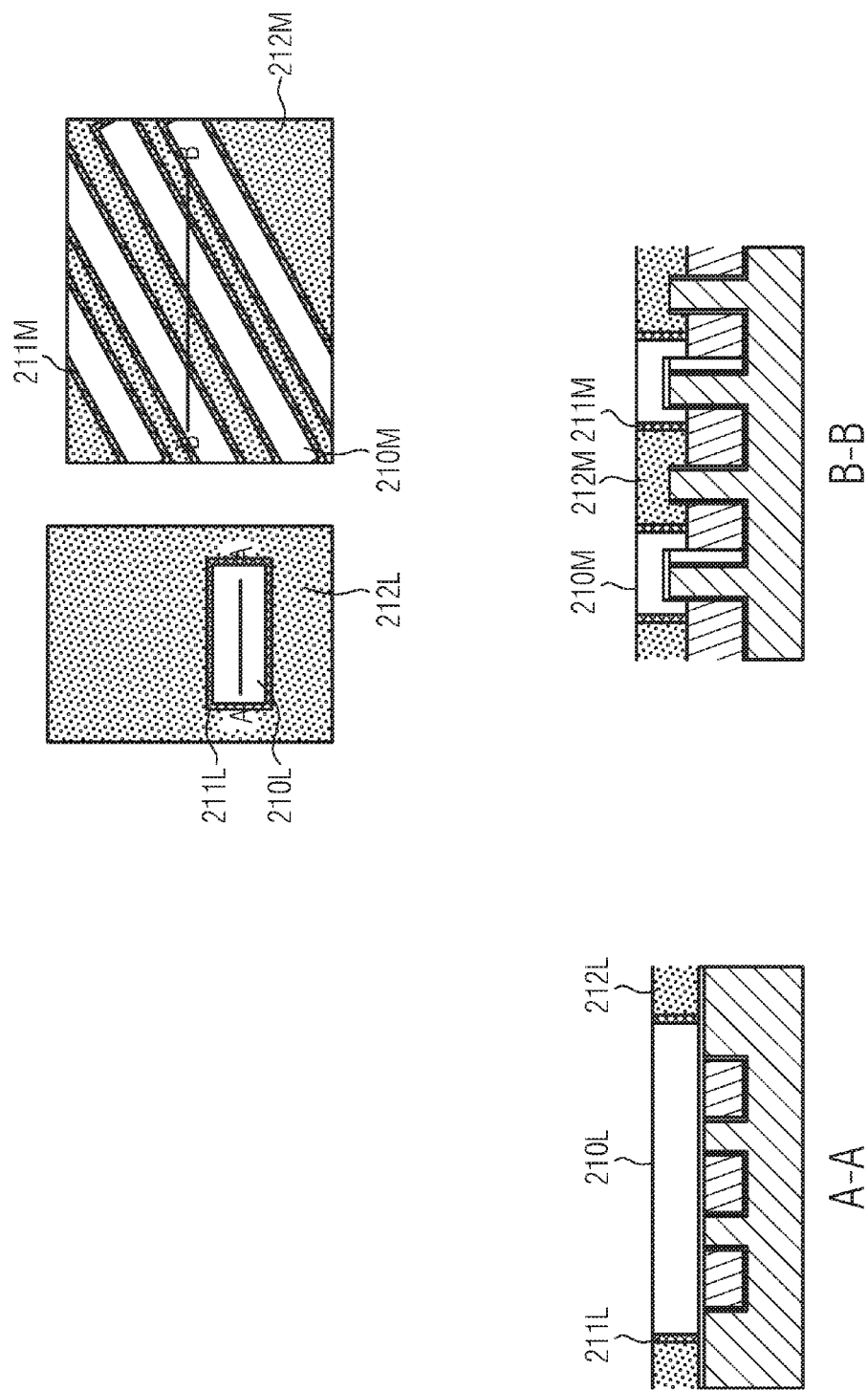

An oxide layer 212L, 212M is formed over the structure shown in FIG. 2h and polished back, for example, by chemical mechanical polishing, to the etching mask 211L, 211M and, after that, the etching mask 211L, 211M is removed in order to obtain the structure shown in FIG. 2i. The etching mask 211L, 211M may be removed by dry etching or by polishing.

Figure 2J:
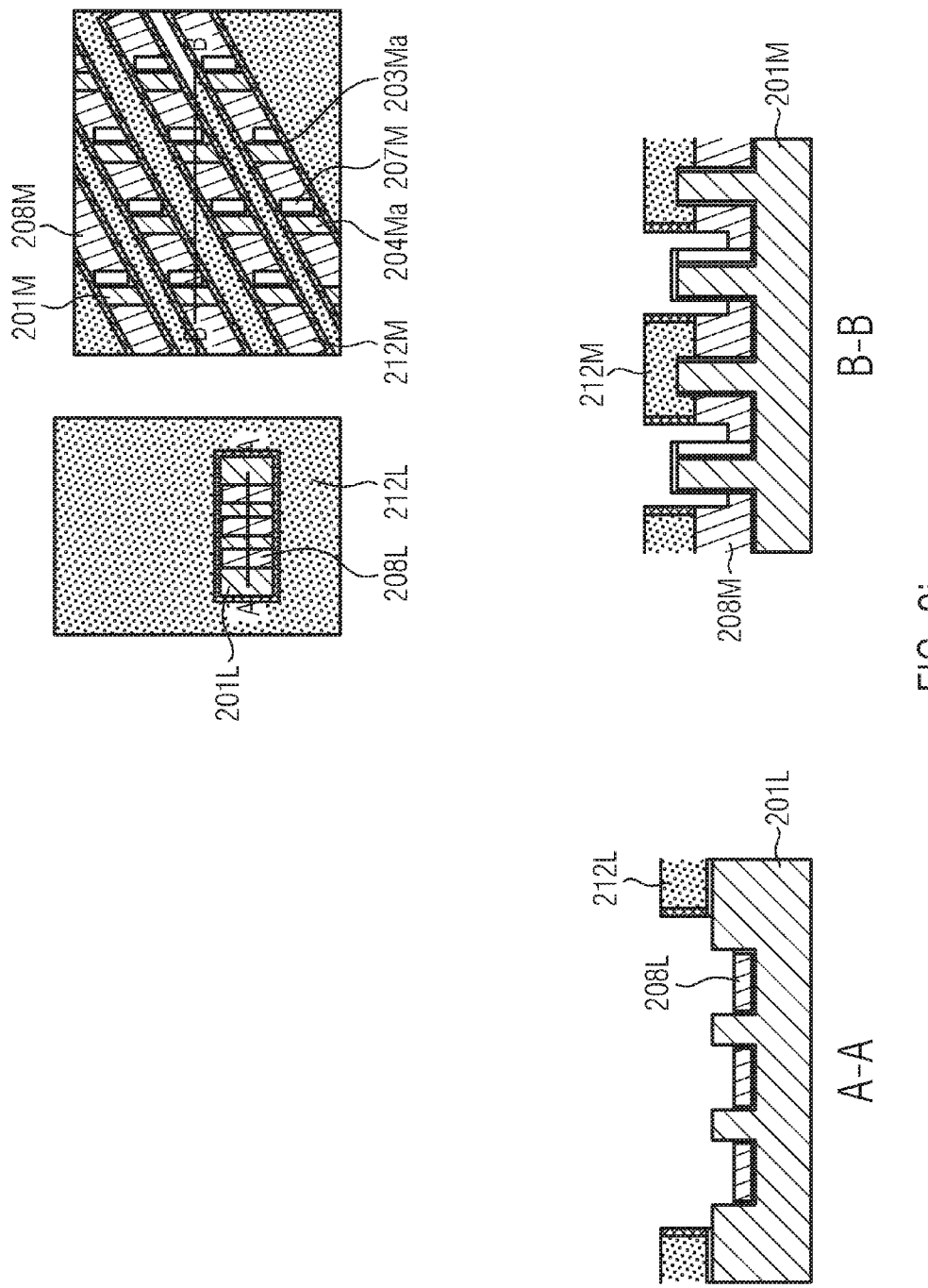
Figure 21:
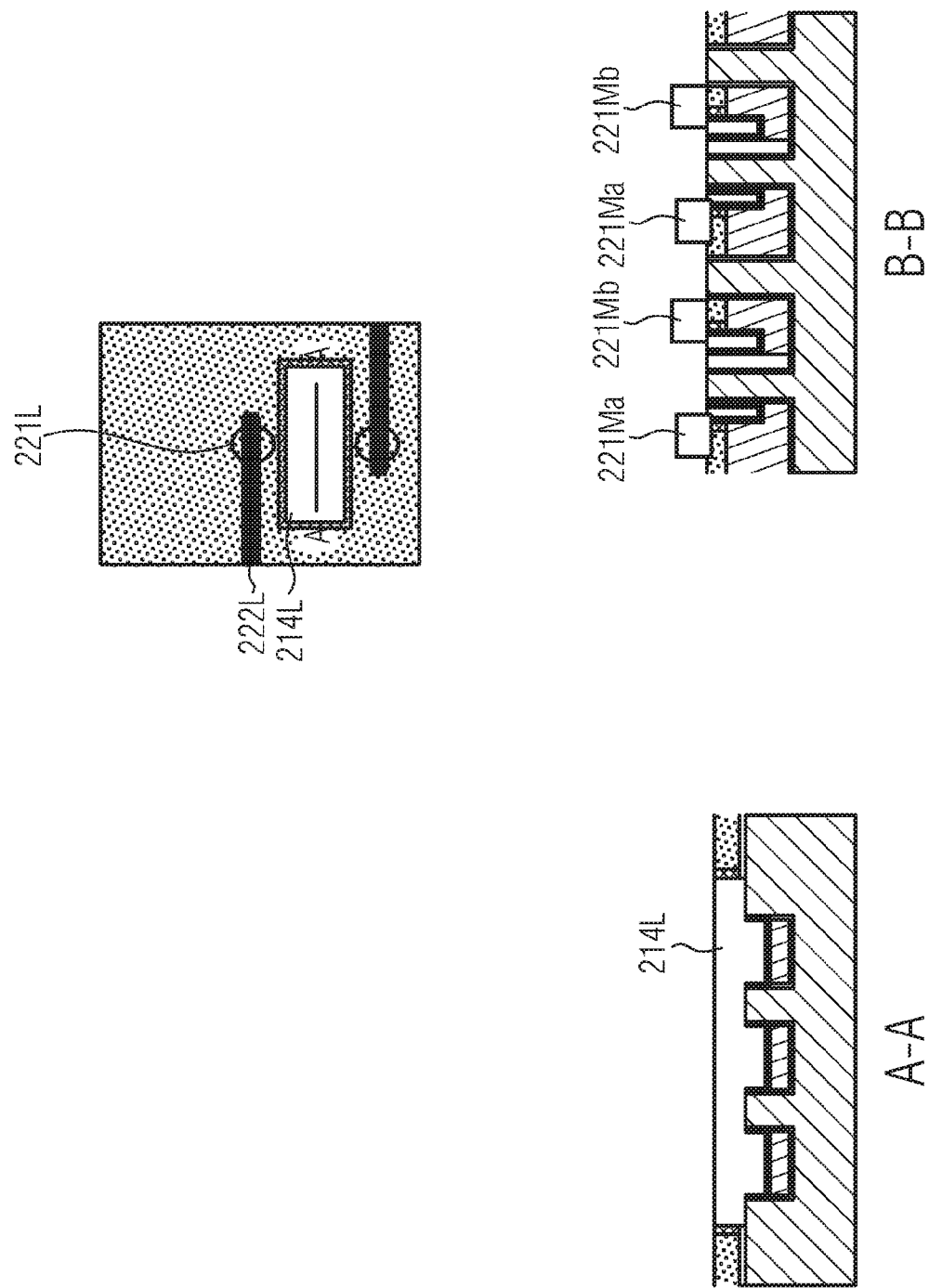

In the manufacturing stage shown in FIG. 2j, the sacrificial electrode layer 210L, 210M is removed, for example, by chemical wet etching and the oxide layer 208L, 208M is recessed to a height level below the one of the semiconductor fins 203L, 203M (203Ma, 203Mb). The sacrificial electrode layer 210L, 210M is etched selectively to the oxide layer 212L, 212M. The protection layer 209L, 209M protects the top surfaces of the semiconductor fins 203L, 203M during the removal of the sacrificial electrode layer 210L, 210M and possibly during the recess formation in the oxide layer 208L, 208M and is subsequently removed.

As shown in FIG. 2k, after removal of the sacrificial electrode layer 210L, 210M, recesses are formed in the oxide layer 208L, 208M and a high-k dielectric layer 213L, 213M is formed in the recesses. A gate electrode layer 214L, 214M, for example, comprising or consisting of a metal, for example, wolfram or aluminum, is filled over the high-k dielectric layer 213L, 213M in the recesses. A work function adjusting material may be additionally formed over the surfaces of the semiconductor fins 203L, 203M. After being filled into the recesses, the gate electrode layer 214L, 214M is planarized, for example, by chemical mechanical polishing, to the height level of the oxide layer 212L, 212M. In the memory area, the planarizing process results in the formation of a sense gate 215 and a control gate 216 separated from the sense gate 215. The gate electrode is 214L is maintained during the planarization due to the reduced height of the semiconductor fins 203L in the logic area as compared to the memory area (confer description of FIG. 2g). In the logic area, a FinFET device comprising at least two semiconductor fins 203L results and in the memory area a plurality of flash memory cells is formed, two of which are illustrated in the bottom row of FIG. 2k. Individual flash memory cells are separated from each other by insulating semiconductor fins 203Mb.

FIG. 2l shows the structure of FIG. 2k after formation of contacts 221L, 221Ma, 221Mb, and the formation of metal lines 222L of a first metallization layer. Before forming the contacts 221L, 221Ma, 221Mb, a silicidation process may be performed to reduce the contact resistance between the contacts and the electrodes of the FinFET device formed in the logic area and the memory cell formed in the memory area. At least parts of the semiconductor fins 103L, 103M (namely, the parts comprising source/drain regions) may be silicided. The resulting metal silicide regions may be comprised of a variety of different materials, such as, for example, nickel silicide, nickel-platinum silicide, cobalt silicide, etc., and the thickness of such metal silicide regions may vary depending upon the particular application. The typical steps performed to form the metal silicide regions involve depositing a layer of refractory metal, performing an initial heating process causing the refractory metal to react with underlying semiconductor material, for example, silicon-containing material, performing an etching process to remove unreacted portions of the layer of refractory metal, and performing an additional heating process to form the final phase of the metal silicide.

As shown in FIG. 2l, in the logic area, metal lines 222L are connected to source/drain regions of the FinFET device via contacts 221L. In the memory area, metal lines are connected to sense gates via contacts 221Ma, other metal lines are connected to control gates via contacts 221Mb.

In general, it is noted that drain and/or source areas of individual semiconductor fins 203 may individually be contacted by an appropriately designed contact structure formed in the interlayer dielectric in order to connect each of the corresponding drain and/source areas of the semiconductor fins with a controllable interconnect structure that may be configured so as to enable, at least once, to control the connection of the end portions to a common node, such as a drain terminal or a source terminal of the transistor. In some illustrative aspects, the controllable interconnect structure may comprise transistor elements, for instance, formed on the basis of less critical constraints compared to the sophisticated FinFET device, thereby providing the possibility of repeatedly reconfiguring the sophisticated transistor elements. The controllable interconnect structure may comprise conductors, such as resistive structures and the like, which may be switched from a low impedance state into a high impedance state at least once so as to enable a disconnection of corresponding semiconductor fins from the common circuit node. For example, the controllable interconnect structure may be connected to external test equipment in order to appropriately set the transistor configuration, for instance, the current drive capability, in accordance with requirements for the specific transistor under consideration, while in other cases, conditionally the actual functional status of the transistor under consideration may be determined and a corresponding control of the interconnect structure may be performed on the basis of the detected functional status.

Whereas the above description was made with respect to a NAND flash memory cell, the process flow of manufacturing a memory cell integrated with a FinFET device may similarly be performed for a NOR architecture, wherein additional landing pads are required, as will readily be appreciated by one skilled in the art.

As a result a non-volatile flash memory cell is provided herein with a single sided sense gate (flash gate) that may be included in a FinFET device, for example, a fully depleted FinFET device. The manufacturing process of the memory cell can be completely integrated in the process flow for forming FinFET devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a flash memory cell, comprising:
   forming a plurality of semiconductor fins on a semiconductor substrate;
   forming floating gates for a sub-set of said plurality of semiconductor fins;
   forming a first insulating layer between said plurality of semiconductor fins;
   recessing said first insulating layer to a height less than a height of said plurality of semiconductor fins;
   forming sacrificial gates over said sub-set of said plurality of semiconductor fins;
   forming a second insulating layer between said sacrificial gates;
   removing said sacrificial gates;
   forming recesses in said first insulating layer; and
   forming sense gates and control gates in said recesses for said sub-set of said plurality of semiconductor fins.

2. The method of claim 1, wherein said sense gates and said control gates are formed by forming a gate layer in said recesses, over said sub-set of said plurality of semiconductor fins and over said second insulating layer and polishing back the thus formed gate layer to a height level of said sub-set of said plurality of semiconductor fins.

3. The method of claim 1, further comprising forming high-k dielectrics between said sense gates and said sub-set of said plurality of semiconductor fins.

4. The method of claim 1, further comprising forming floating gates between said sub-set of said plurality of semiconductor fins and said control gates.

5. The method of claim 1, further comprising forming a protection layer above said plurality of semiconductor fins after recessing said first insulating layer and before forming said sacrificial gates.

6. The method of claim 5, further comprising removing said protection layer after removing said sacrificial gates.

7. The method of claim 1, further comprising forming a first layer of insulating material over said plurality of semiconductor fins prior to forming said floating gates.

8. The method of claim 1, further comprising forming a high-k dielectric layer in said recesses prior to forming said sense gates and said control gates.

9. The method of claim 1, wherein forming said sense gates and said control gates comprises:
    forming a metal layer to overfill said recesses; and
    planarizing said metal layer and said second insulating layer to expose upper surfaces of said plurality of semiconductor fins, said sense gates, and said control gates.

10. The method of claim 9, further comprising forming contacts above and in contact with said upper surfaces of said sense gates and said control gates.

11. A method of manufacturing a flash memory cell, comprising:
    forming a first plurality of semiconductor fins on a semiconductor substrate;
    forming floating gates for a sub-set of said first plurality of semiconductor fins on sidewall surfaces of said sub-set of said first plurality of semiconductor fins;
    forming a first insulating layer between said first plurality of semiconductor fins;
    recessing said first insulating layer to a height less than a height of said first plurality of semiconductor fins;
    forming sacrificial gates over said sub-set of said first plurality of semiconductor fins;
    forming a second insulating layer between said sacrificial gates;
    removing said sacrificial gates to define first gate recesses on a first side of said sub-set of said first plurality of semiconductor fins and a second gate recesses on a second side of said sub-set of said first plurality of semiconductor fins proximate said floating gates;
    extending said first and second gate recesses into said first insulating layer; and
    forming sense gates in said first gate recesses and control gates in said second gate recesses.

12. The method of claim 11, further comprising forming a protection layer above said first plurality of semiconductor fins after recessing said first insulating layer and before forming said sacrificial gates.

13. The method of claim 11, further comprising forming a first layer of insulating material over said first plurality of semiconductor fins prior to forming said floating gates.

14. The method of claim 11, further comprising forming a high-k dielectric layer in said first and second gate recesses prior to forming said sense gates and said control gates.

15. The method of claim 11, wherein forming said sense gates and said control gates comprises:
    forming a metal layer to overfill said first and second gate recesses; and
    planarizing said metal layer and said second insulating layer to expose upper surfaces of said first plurality of semiconductor fins, said sense gates, and said control gates.

16. The method of claim 15, further comprising forming contacts above and in contact with said upper surfaces of said sense gates and said control gates.

17. The method of claim 11, wherein forming said floating gates comprises:
    forming a floating gate material layer above said first plurality of semiconductor fins;
    forming an angled mask layer across said first plurality of semiconductor fins;
    implanting ions into portions of said floating gate material layer not covered by said angled mask layer to define implant regions; and
    selectively removing said implant regions to define said floating gates.

18. The method of claim 11, further comprising:
    forming a second plurality of semiconductor fins on said semiconductor substrate;
    forming said first insulating layer between said second plurality of semiconductor fins;
    forming one of said sacrificial gates above said second plurality of semiconductor fins;
    removing said sacrificial gate above said second plurality of sacrificial gates to define a third gate recess above said second plurality of semiconductor gates;
    extending said third gate recess concurrently with extending said first and second gate recesses; and
    forming a gate electrode in said third recess concurrently with forming said sense gates and said control gates.

19. The method of claim 18, further comprising reducing a height of said second plurality of semiconductor fins relative to said height of said first plurality of semiconductor fins.

20. The method of claim 18, wherein forming said gate electrode, said sense gates, and said control gates comprises forming a conductive layer in said first, second, and third gate recesses.

* * * * *